(12) United States Patent
Bandoh et al.

(10) Patent No.: US 7,287,975 B2
(45) Date of Patent: Oct. 30, 2007

(54) RESIN MOLD MATERIAL AND RESIN MOLD

(75) Inventors: Kazuhiko Bandoh, Kyoto (JP); Keiji Maeda, Kyoto (JP); Takaki Kuno, Kyoto (JP); Yoshinori Noguchi, Kyoto (JP); Satoshi Kitaoka, Nagoya (JP); Naoki Kawashima, Nagoya (JP)

(73) Assignees: Towa Corporation, Kyoto-shi (JP); Japan Fine Ceramics Center, Nagoya-shi (JP)

( * ) Notice: Subject to any disclaimer, the term of this patent is extended or adjusted under 35 U.S.C. 154(b) by 295 days.

(21) Appl. No.: 10/855,210

(22) Filed: May 26, 2004

(65) Prior Publication Data

US 2004/0253334 A1    Dec. 16, 2004

(30) Foreign Application Priority Data

Jun. 12, 2003   (JP)   ............................. 2003-167206

(51) Int. Cl.
B29C 33/10   (2006.01)

(52) U.S. Cl. ..................... 425/470; 249/141; 425/812

(58) Field of Classification Search ................ 425/437, 425/470, 812; 249/141
See application file for complete search history.

(56) References Cited

U.S. PATENT DOCUMENTS

| | | | | |
|---|---|---|---|---|
| 3,482,703 A | * | 12/1969 | Surprenant et al. ......... | 210/489 |
| 3,751,271 A | * | 8/1973 | Kimura et al. ................ | 501/85 |
| 3,804,566 A | | 4/1974 | Kimura et al. | |
| 3,822,857 A | * | 7/1974 | Tanie ........................... | 249/141 |
| 4,091,069 A | | 5/1978 | Allen | |
| 5,564,067 A | * | 10/1996 | Hendricks .................... | 428/566 |
| 6,238,618 B1 | | 5/2001 | Brundage et al. | |
| 6,254,822 B1 | | 7/2001 | Brundage | |
| 2005/0082704 A1 | * | 4/2005 | Hirose ......................... | 264/39 |

FOREIGN PATENT DOCUMENTS

| | | | |
|---|---|---|---|
| EP | 0 713 248 | | 5/1996 |
| EP | 1331081 A1 | * | 7/2003 |
| JP | 62074613 | | 4/1987 |
| JP | 01110926 A | * | 4/1989 |
| JP | 07314457 A | * | 12/1995 |
| JP | 08057862 A | * | 3/1996 |
| JP | 08192438 | | 7/1996 |

(Continued)

Primary Examiner—Robert B. Davis
(74) Attorney, Agent, or Firm—W. F. Fasse; W. G. Fasse

(57) ABSTRACT

A resin mold material includes one-dimensional communicating holes extending substantially linearly from a mold surface and having diameters from 1 nm to less than 10 μm; a surface layer including the mold surface and the one-dimensional communicating holes; a support layer covering a back of the surface layer; and three-dimensional communicating holes communicating with the one-dimensional communicating holes in the support layer and having diameters larger than those of the one-dimensional communicating holes. Accordingly, a liquid resin is unlikely to enter the one-dimensional communicating holes, thereby reducing a contact area of the mold surface and the liquid resin, i.e., the mold surface is repellant to the liquid resin. Gas in a mold cavity bounded by the mold surface is discharged through the one-dimensional and three-dimensional communicating holes sequentially. Consequently, a release property of a molded product from the mold surface is improved and generation of voids is suppressed.

15 Claims, 3 Drawing Sheets

FOREIGN PATENT DOCUMENTS

| | | | |
|---|---|---|---|
| JP | 09029750 A | * | 2/1997 |
| JP | 09-076213 | | 3/1997 |
| JP | 2000109374 | | 4/2000 |
| JP | 2000154027 A | * | 6/2000 |
| JP | 2003137671 | | 5/2003 |
| JP | 2003-236843 | | 8/2003 |
| JP | 2003245923 A | * | 9/2003 |

* cited by examiner

RESIN MOLD MATERIAL AND RESIN MOLD

BACKGROUND OF THE INVENTION

1. Field of the Invention

The present invention relates to a resin mold material and a resin mold fabricated with the same, and more particularly to a resin mold material and a resin mold used when a molded product containing a cured resin obtained by curing a liquid resin filling a cavity is manufactured.

2. Description of the Background Art

Conventionally, when a molded product containing a cured resin obtained by curing a liquid resin filling a cavity is manufactured, transfer molding or injection molding has been employed. In such molding, the liquid resin is cured in the cavity while a mold is clamped, and the molded product is taken out after opening the mold. Depending on a type of the cured resin, however, release property of the cured resin from a mold surface may become poor. Accordingly, in order to ensure release of the molded product, an ejector pin is used to press a part of the molded product for ejection thereof. In addition, in some molded products, if voids remain in the cured resin, it may be disadvantageous in terms of reliability or appearance. In such a case, an air vent is provided in the mold so that a gas in the cavity is suctioned through the air vent from the outside of the mold. Discharge of the gas contained in the liquid resin and reduction in pressure in filling the cavity with the liquid resin are thus achieved.

On the other hand, when ejection by means of the ejector pin or suction through the air vent is adopted, a structure of the mold tends to be complicated. In addition, when the molded product is small, excessive force is applied to a part of the molded product by ejection using the ejector pin, resulting in deformation or discoloration of the molded product. As an exemplary manner of resin molding, a chip-type electronic element (hereinafter, referred to as "chip") such as a semiconductor chip including wire interconnections is accommodated in a cavity, which is in turn filled with the liquid resin in a clamped state, and the resin is cured so as to complete a package. In this case, as the package is made thinner, ejection by means of the ejector pin may cause disconnection of wires and breakage or deformation of the chip and the package.

In order to solve the above-mentioned problems, Japanese Patent Laying-Open Nos. 62-74613 and 8-192438, for example, propose to fabricate a resin mold with a porous body. According to these proposals, suction is carried out through the resin mold fabricated with the porous body, whereby discharge of a gas contained in the liquid resin and reduction in pressure in filling the cavity with the liquid resin are achieved. In addition, when the mold is opened, a high pressure gas such as compressed air is supplied to a mold surface through the resin mold fabricated with the porous body. In this manner, the molded product can be released without using the ejector pin.

A material for the porous body used in the conventional example will now be described. First, Japanese Patent Laying-Open No. 62-74613, in which at least one of the mold (female mold) is formed with porous ceramics in its entirety, discloses mullite-based ceramics as an example of porous ceramics. Meanwhile, Japanese Patent Laying-Open No. 8-192438, in which the mold body, a part of the mold, or a filter layer formed on its surface is fabricated with the porous material, discloses as the porous material, a sintered material obtained by sintering metal powders or ceramics powders.

Here, holes that are formed in the conventional examples will be described. First, Japanese Patent Laying-Open No. 62-74613 disclosing porous ceramics composed of mullite-based ceramics does not mention how the "holes" are. On the other hand, other patent documents such as Japanese Patent Laying-Open Nos. 2000-109374 and 2003-137671 disclose that mullite-based ceramics includes communicating holes linking like a network and communicating in a three-dimensional manner (hereinafter, referred to as "three-dimensional communicating hole"). In addition, according to Japanese Patent Laying-Open No. 8-192438, formed holes are three-dimensional communicating holes, as clearly shown in FIGS. 10 and 19.

The conventional techniques described above, however, suffer from problems due to the fact that the formed holes are three-dimensional communicating holes. First, since the three-dimensional communicating holes have an irregular shape and run in a winding manner, a distance of suction is long and a number of protruded and recessed portions are present on an inner wall. Accordingly, when the gas in the cavity is suctioned through the three-dimensional communicating holes or when a compressed gas is supplied to the mold surface, pressure loss increases. Consequently, the gas cannot completely be removed from the liquid resin, resulting in generation of voids in the molded product. Further, an effect to release the molded product by means of the compressed gas may be lowered. Secondly, since the three-dimensional communicating holes have an irregular shape both in two-dimension and in cross-section, an area occupied by an opening of the three-dimensional communicating hole in the mold surface may be sometimes large and sometimes small. When the opening area is large, the liquid resin is readily introduced in the three-dimensional communicating holes, whereby the cured resin is likely to be caught on the inner wall of the three-dimensional communicating holes in the vicinity of the mold surface. This is particularly the case with the three-dimensional communicating holes extending and spreading two-dimensionally toward a portion located deeper from the mold surface. In other words, because of what is called an anchor effect, adhesion between the mold surface including the inner wall of the three-dimensional communicating holes and the cured resin is increased, resulting in deterioration of release property. Thirdly, as the opening area in the mold surface is not uniform, a two-dimensional shape and an area of the mold surface between the three-dimensional communicating holes are not uniform either. Therefore, even when the mold is manufactured with the same porous material, variation in release property at the mold surface may be considerable.

SUMMARY OF THE INVENTION

The present invention was made to solve the above-described problems. An object of the present invention is to provide a resin mold material and a resin mold capable of improving release property of a molded product from the mold surface and suppressing generation of voids.

In order to solve the above-described technical problems, a resin mold material according to the present invention composes a resin mold used when a molded product is manufactured by curing a liquid resin in a cavity. The resin mold material is characterized by including a large number of one-dimensional communicating holes that extend substantially linearly from a surface to serve as a mold surface in the resin mold toward the inside and have a small hole diameter.

In such a resin mold material, since a large number of one-dimensional communicating holes having a small hole diameter extend substantially linearly from the surface to serve as the mold surface toward the inside, a large number of small spaces containing air are provided in the vicinity of the surface to serve as the mold surface. Accordingly, a contact area between the surface to serve as the mold surface and the liquid resin is made smaller, resulting in lower wettability of the entire mold surface with respect to the liquid resin. In addition, a large number of small spaces containing air are present at an interface between the surface to serve as the mold surface and the liquid resin. As the air is less prone to be wetted with the liquid resin, this property also contributes to lower wettability of the entire surface to serve as the mold surface with respect to the liquid resin. Therefore, adhesion between the surface to serve as the mold surface and the cured resin formed by curing the liquid resin is lowered. Moreover, when the gas in the cavity is discharged through the one-dimensional communicating holes extending substantially linearly, pressure loss is reduced.

In the resin mold material according to the present invention, the one-dimensional communicating hole has a hole diameter in a range from at least 1 nm to less than 10 μm.

With such a resin mold material, an opening having a diameter in a range from at least 1 nm to less than 10 μm is formed on the surface to serve as the mold surface. Therefore, as introduction of the liquid resin into the one-dimensional communicating holes through the opening is suppressed, adhesion between the surface to serve as the mold surface and the cured resin formed by curing the liquid resin is lowered.

The resin mold material according to the present invention includes a surface layer including the surface to serve as the mold surface and the one-dimensional communicating holes, and a support layer covering a back face side of the surface layer. The support layer includes a large number of three-dimensional communicating holes communicating to the one-dimensional communicating holes. The three-dimensional communicating hole has a hole diameter larger than that of the one-dimensional communicating hole.

With such a resin mold material, as introduction of the liquid resin into the one-dimensional communicating holes is suppressed on the surface to serve as the mold surface in the surface layer, adhesion between the surface to serve as the mold surface and the cured resin formed by curing the liquid resin is lowered. In addition, the three-dimensional communicating holes communicating to the one-dimensional communicating holes and having a hole diameter larger than that of the one-dimensional communicating hole are provided in the support layer. Therefore, when the gas in the cavity is discharged through the one-dimensional communicating holes and the three-dimensional communicating holes sequentially, pressure loss is further reduced.

In addition, in the resin mold material according to the present invention, the support layer is conductive and generates heat when a current flows therethrough.

With such a resin mold material, a self-heating support layer is provided above the surface to serve as the mold surface, with the surface layer interposed. Therefore, the surface to serve as the mold surface can efficiently be heated and that temperature is maintained.

Moreover, a resin mold according to the present invention is used when a molded product is manufactured by curing a liquid resin in a cavity, and fabricated with any resin mold material described above.

With such a resin mold, adhesion between the mold surface and the cured resin formed by curing the liquid resin is lowered. In addition, a resin mold in which pressure loss in discharging the gas in the cavity is reduced and the mold surface is efficiently heated and the temperature is maintained is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
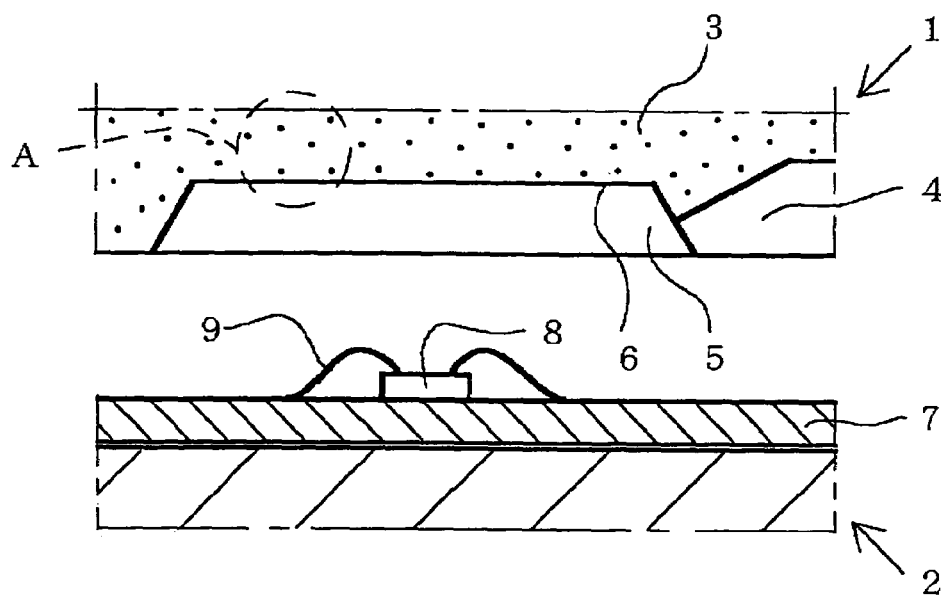
FIG. 1A is a cross-sectional view showing a state immediately before clamping of a resin mold fabricated with a resin mold material according to a first embodiment of the present invention.
Figure 1B:
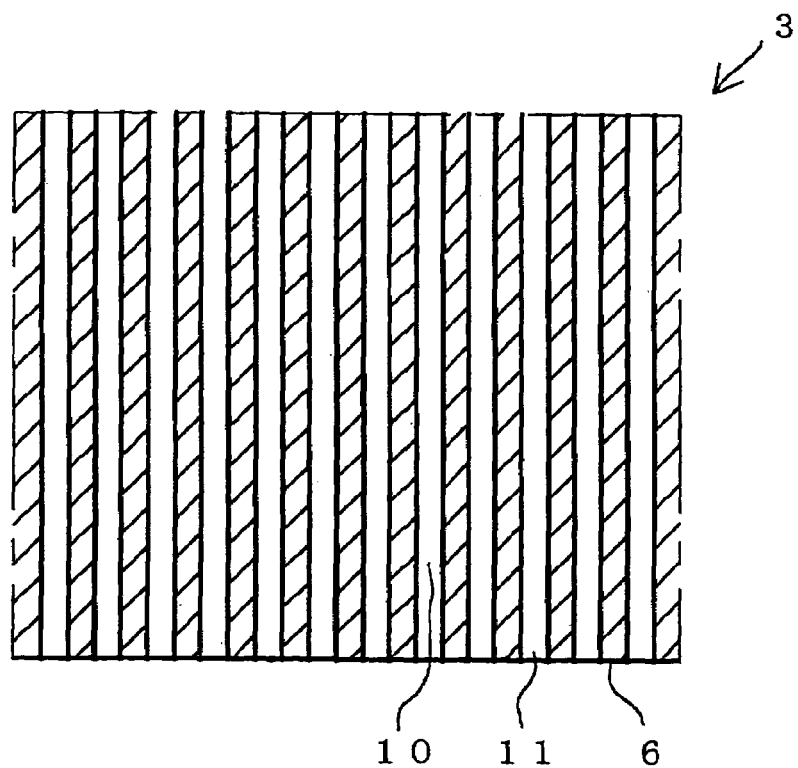
FIG. 1B is a cross-section showing an enlarged view of a portion A in FIG. 1A of the resin mold material according to the present embodiment.

A first embodiment of the present invention will be described with reference to FIGS. 1A and 1B. FIG. 1A is a cross-sectional view showing a state immediately before clamping of the resin mold fabricated with the resin mold material according to the present embodiment, while FIG. 1B is a cross-section showing an enlarged view of a portion A in FIG. 1A of the resin mold material according to the present embodiment. In the following, resin sealing in which a chip including wire interconnections is accommodated in a cavity, which is filled with the liquid resin in a clamped state, and the resin is cured so as to complete a package will be described as an example of resin molding.

In FIG. 1A, an upper mold 1 and a lower mold 2 together implement a resin-seal mold, that is, a resin mold. Upper mold 1 is fabricated with a resin mold material 3 according to the present embodiment. Upper mold 1 is provided with a resin flow path 4 through which the liquid resin (not shown) flows and a cavity 5 filled with the liquid resin. That is, resin mold material 3 is exposed to a mold surface 6 in resin flow path 4 and cavity 5. On the other hand, lower mold 2 is fabricated with tool steel or the like, and a substrate 7 implemented by a leadframe or a printed board is placed thereon. A chip 8 is mounted on substrate 7, and an electrode (not shown) on substrate 7 and an electrode (not shown) on chip 8 are electrically connected by a wire 9.

An operation of the resin mold shown in FIG. 1A will now be described. Initially, substrate 7 is positioned and arranged on lower mold 2, and fixed by a method such as adsorption. Then, upper mold 1 is lowered so as to complete clamping to lower mold 2. Thereafter, by pressing the liquid resin composed of a thermosetting resin and having a prescribed viscosity, for example, cavity 5 is filled with the liquid resin through resin flow path 4. A heater (not shown) provided in upper mold 1 and lower mold 2 is used to heat the liquid resin for curing, thus forming the cured resin. Upper mold 1 is then moved upward to open the mold, and the molded product obtained by integrally sealing substrate 7, chip 8 and wire 9 with the cured resin is taken out.

The resin mold material according to the present embodiment will now be described with reference to FIG. 1B. In FIG. 1B, resin mold material 3 consists essentially of a material having excellent abrasion resistance among ceramics, for example, zirconia. In resin mold material 3, communicating holes extending substantially linearly (hereinafter, referred to as "one-dimensional communicating hole") are formed. Here, a large number of one-dimensional communicating holes 10 extending substantially perpendicularly toward the inside from mold surface 6 (upward in the drawing) and having a small hole diameter are formed. One-dimensional communicating hole 10 has a small hole diameter in a range from at least 1 nm to less than 10 µm, preferably less than 1000 nm. In addition, preferably, a hole diameter dimension is substantially equal and uniform both in a direction of depth in one-dimensional communicating hole 10 and among a large number of one-dimensional communicating holes 10. In other words, a large number of one-dimensional communicating holes 10 have a columnar shape and a hole diameter of a substantially equal and uniform value. Therefore, the diameter of each opening 11 formed in mold surface 6 is also set to a substantially equal and uniform dimension of at least 1 nm to less than 10 µm, preferably less than 1000 nm. Moreover, as to a portion of mold surface 6 among one-dimensional communicating holes 10, a dimension between outer edges of one-dimensional communicating holes 10 is also equal to the diameter of opening 11. That is, a substantially equal and uniform dimension of at least 1 nm to less than 10 µm, preferably less than 1000 nm, is attained between one-dimensional communicating holes 10.

A function of resin mold material 3 and upper mold 1 serving as the resin mold fabricated with the former in resin molding will now be described. First, opening 11 has a dimension of at least 1 nm to less than 10 µm, preferably less than 1000 nm. On the other hand, a filler which may be contained in the liquid resin (not shown) has a diameter not smaller than 1 µm. Therefore, introduction of the liquid resin into one-dimensional communicating holes 10 through opening 11 is suppressed. Even if the liquid resin is introduced in one-dimensional communicating holes 10, depth of introduction can be very small. In addition, the hole diameter of one-dimensional communicating holes 10 is small and substantially uniform also in a direction of depth, of which value is at least 1 nm to less than 10 µm, preferably less than 1000 nm. As the protruded and recessed portions are not present on the inner wall of one-dimensional communicating holes 10, the cured resin is less likely to be caught on the inner wall. In this manner, a contact area between the inner wall of one-dimensional communicating holes 10 and the cured resin is made smaller. Therefore, as an anchor effect by the cured resin in one-dimensional communicating holes 10 can be suppressed, adhesion between mold surface 6 and the cured resin is lowered.

Secondly, on mold surface 6, a number of small openings 11 containing air are provided by one-dimensional communicating holes 10 having a substantially uniform hole diameter dimension of at least 1 nm to less than 10 µm and portions of mold surface 6 among one-dimensional communicating holes 10 having a dimension substantially uniform and equal to the former. In this manner, the contact area between mold surface 6 and the liquid resin is made smaller, and wettability of entire mold surface 6 with respect to the liquid resin is lowered. Therefore, adhesion between mold surface 6 and the cured resin is lowered.

Thirdly, the dimension between the outer edges of one-dimensional communicating holes 10 attains a substantially uniform value of at least 1 nm to less than 10 µm, which is substantially equal to the hole diameter dimension of one-dimensional communicating hole 10. Accordingly, mold surface 6 comes in contact with the liquid resin in a portion occupying a small area among one-dimensional communicating holes 10. As such, small openings 11 containing air are uniformly distributed at the interface between mold surface 6 and the liquid resin. Here, as the air is less prone to be wetted with the liquid resin, entire mold surface 6 acts in a manner repellant to the viscous liquid resin. This property also contributes to lower wettability of entire mold surface 6 with respect to the liquid resin, resulting in lower adhesion between mold surface 6 and the cured resin.

Fourthly, one-dimensional communicating holes 10 extend substantially perpendicularly and substantially linearly toward the inside from mold surface 6 and have a hole diameter dimension of substantially equal and uniform value in a direction of depth. As such, one-dimensional communicating holes 10 serving as a gas flow path extend substantially linearly, and there are not many protruded and recessed portions on the inner wall. Accordingly, when the gas in cavity 5 is discharged by a pressure from the liquid resin through one-dimensional communicating holes 10 or suctioned, pressure loss in one-dimensional communicating holes 10 is reduced. Therefore, discharge of the gas contained in the liquid resin and pressure reduction in filling the cavity with the liquid resin can effectively be achieved.

Fifthly, resin mold material 3 fabricating upper mold 1 consists essentially of a material having excellent abrasion resistance among ceramics, for example, zirconia. Therefore, even if the liquid resin (not shown) containing the filler should flow, abrasion on mold surface 6 is suppressed.

As described above, according to the present embodiment, adhesion between mold surface 6 and the cured resin is lowered, thereby improving release property of the molded product from mold surface 6. In addition, the gas contained in the liquid resin is effectively discharged, thereby suppressing generation of voids and reducing pressure in filling the cavity with the liquid resin. Further, abrasion on mold surface 6 is suppressed.

In the description above, upper mold 1 alone has been fabricated with resin mold material 3 according to the present embodiment. It is noted that lower mold 2 may also be fabricated with resin mold material 3. Here, an adsorption mechanism is connected to a back face of lower mold 2 so that substrate 7 can be adsorbed through one-dimensional communicating holes 10 for holding substrate 7 in a stable manner.

Second Embodiment

Figure 2A:
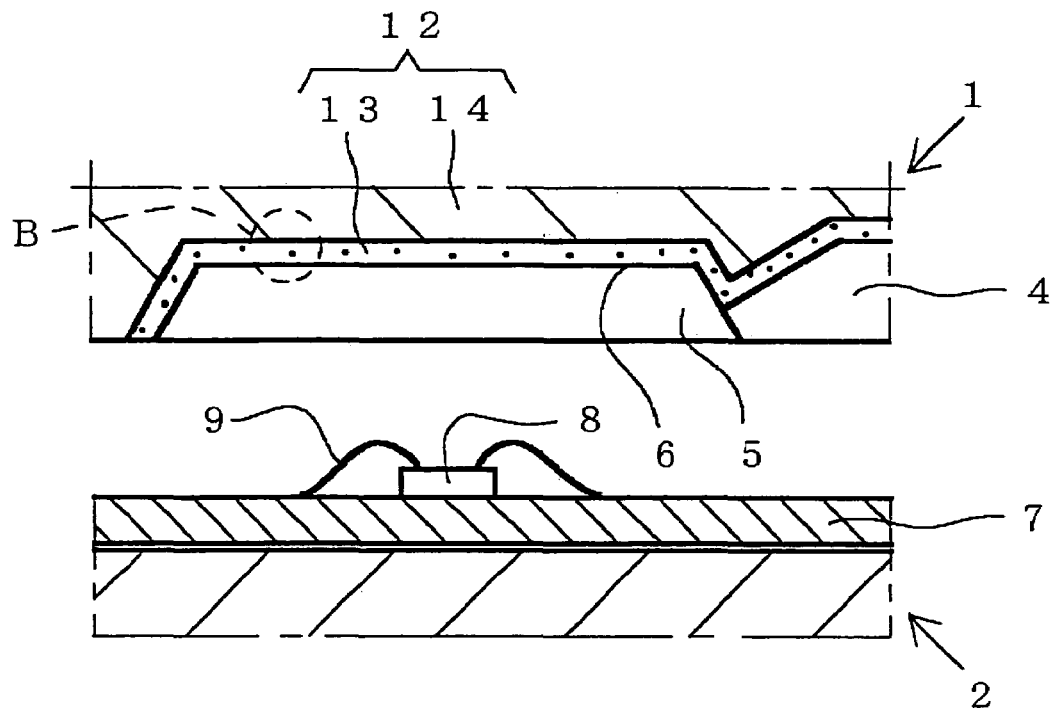
FIG. 2A is a cross-sectional view showing a state immediately before clamping of a resin mold fabricated with a resin mold material according to a second embodiment of the present invention.

A second embodiment of the present invention will be described with reference to FIGS. 2A and 2B. FIG. 2A is a cross-sectional view showing a state immediately before clamping of a resin mold fabricated with a resin mold material according to the present embodiment, while FIG. 2B is a cross-section showing an enlarged view of a portion B in FIG. 2A of the resin mold material according to the present embodiment.

Figure 2B:
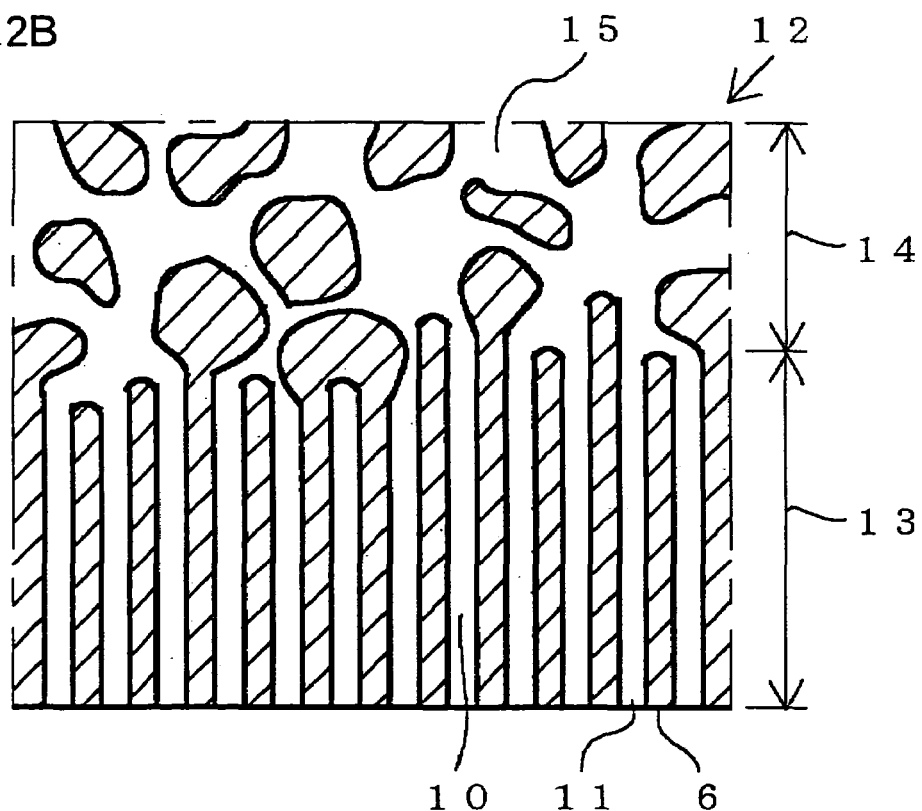
FIG. 2B is a cross-section showing an enlarged view of a portion B in FIG. 2A of the resin mold material according to the present embodiment.

As shown in FIGS. 2A, 2B, upper mold 1 is fabricated with a resin mold material 12 according to the present embodiment. Resin mold material 12 has a two-layered structure of a surface layer 13 and a support layer 14. Surface layer 13 includes mold surface 6, and is fabricated with the same material as in resin mold material 3 in the first embodiment. On the other hand, though support layer 14 consists essentially of zirconia as in resin mold material 3, it includes three-dimensional communicating holes 15 running and communicating in a three-dimensional manner as shown in FIG. 2B, instead of the one-dimensional communicating holes. One-dimensional communicating holes 10 and three-dimensional communicating holes 15 communicate to each other around an interface between surface layer 13 and support layer 14. In the present embodiment, surface layer 13 preferably has a thickness of at least 1 μm to less than 100 μm. In addition, three-dimensional communicating hole 15 preferably has a hole diameter larger than that of one-dimensional communicating hole 10, for example of not smaller than 10 μm.

Briefly speaking, resin mold material 12 is manufactured in the following manner. Initially, a porous body consisting essentially of zirconia and having three-dimensional communicating holes 15 is formed by molding and baking in advance. Then, the porous body is subjected to working so as to form a prescribed shape such as resin flow path 4 and cavity 5. Here, a worked part of the porous body serves as support layer 14. Next, a layer containing zirconia is formed on the surface of the worked porous body under a prescribed atmosphere, using a method such as PVD (physical vapor deposition), CVD (chemical vapor deposition), and sputtering. Heat treatment under a prescribed condition is then performed so as to form one-dimensional communicating holes 10 in that layer, whereby surface layer 13 is formed. It is noted that both surface layer 13 and support layer 14 contain zirconia and therefore excellent adhesion at the interface therebetween is attained. If excellent adhesion to surface layer 13 can be achieved, support layer 14 may consist of a material not containing zirconia, that is, a material different from that for surface layer 13.

According to the present embodiment, surface layer 13 including mold surface 6 has a large number of one-dimensional communicating holes 10 that communicate to three-dimensional communicating holes 15 in support layer 14. In addition, surface layer 13 has a small thickness of at least 1 μm to less than 100 μm, for example. Moreover, whereas one-dimensional communicating hole 10 has a hole diameter of at least 1 nm to less than 10 μm, preferably less than 1000 nm, three-dimensional communicating hole 15 has a hole diameter larger than that of one-dimensional communicating hole 10. In this manner, an effect the same as in the first embodiment can be obtained. Further, presence of three-dimensional communicating holes 15 contributes to further reduction in pressure loss toward mold surface 6. Therefore, discharge of the gas contained in the liquid resin and pressure reduction in filling the cavity with the liquid resin can further effectively be achieved.

As a variation of the present embodiment, support layer 14 may be formed by kneading and baking particulates composed of a conductive material. Support layer 14 can thus be conductive. In this case, resistivity of support layer 14 can be changed by varying conductivity or a mixing ratio of the conductive material as appropriate. Accordingly, support layer 14 itself can generate heat by setting resistivity of support layer 14 to an appropriate value and applying a voltage thereto. Then, by varying the applied voltage, duty cycle or pulse width, a heat-generating temperature of support layer 14 can be controlled. According to this variation, directly under surface layer 13 having a small thickness of at least 1 μm to less than 100 μm, support layer 14 itself formed in intimate contact with surface layer 13 generates heat. Therefore, mold surface 6 can efficiently be heated to a prescribed temperature (180° C., for example) required for resin molding and the temperature can be maintained. Energy saving in resin molding can thus be attained. In addition, effective cleaning of mold surface 6 can be achieved by heating mold surface 6 to an appropriate temperature.

Third Embodiment

A third embodiment of the present invention will be described with reference to FIGS. 3A and 3B.

Figure 3A:
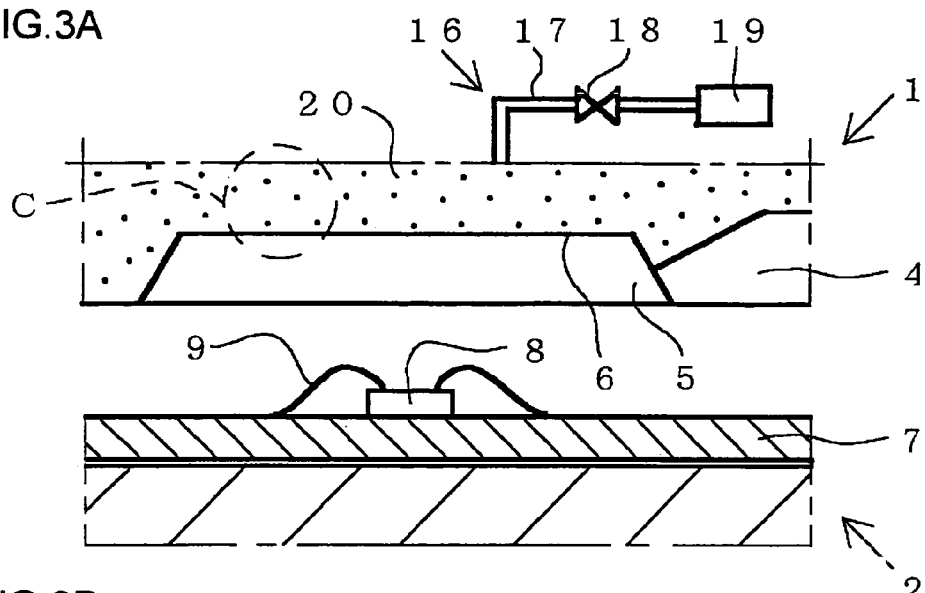
FIG. 3A is a cross-sectional view showing a state immediately before clamping of a resin mold fabricated with a resin mold material according to a third embodiment of the present invention.

As shown in FIG. 3A, a suction mechanism 16 is connected to the back surface of upper mold 1 in the present embodiment. More specifically, a pipe 17 is connected to the back surface of upper mold 1 and also to a suction pump 19 via a valve 18. As shown in FIG. 3B, upper mold 1 is fabricated with a resin mold material 20 according to the present embodiment. Resin mold material 20 has a three-layered structure. That is, resin mold material 20 is constituted of surface layer 13 including a large number of one-dimensional communicating holes 10 and mold surface 6; support layer 14 including a large number of three-dimensional communicating holes 15; and an intermediate layer 21 interposed between surface layer 13 and support layer 14. Connecting holes 22 communicating from one-dimensional communicating holes 10 to three-dimensional communicating holes 15 are formed in intermediate layer 21. Preferably, a diameter of connecting hole 22 gradually increases from a side of one-dimensional communicating holes 10 toward three-dimensional communicating holes 15. For the sake of simplicity of illustration, surface layer 13, intermediate layer 21 and support layer 14 are not distinguished in FIG. 3A.

According to the present embodiment, surface layer 13 including mold surface 6 includes a large number of one-dimensional communicating holes 10, which communicate to three-dimensional communicating holes 15 in support layer 14 through connecting holes 22 in intermediate layer 21. Connecting hole 22 has a diameter increasing from the side of one-dimensional communicating holes 10 toward three-dimensional communicating holes 15. In this manner, the effect the same as in the first embodiment is achieved, and pressure loss toward mold surface 6 can further be reduced. In addition, as suction mechanism 16 is connected to the back face of upper mold 1, discharge of the gas contained in the liquid resin and pressure reduction in filling the cavity with the liquid resin can further effectively be achieved. Moreover, presence of connecting holes 22 of which diameter gradually varies contributes to reduction in residual stress between surface layer 13 and support layer 14.

In the description of each embodiment above, when chip 8 mounted on substrate 7 is resin-sealed, the present invention has been applied to the resin mold used for transfer molding. The present invention, however, is not limited to such an example. The present invention is applicable to resin molding other than resin sealing, or to resin molding in which the liquid resin fills a space and is cured, i.e., a resin mold used for injection molding, for example.

The direction in which one-dimensional through hole 10 extends has been assumed as substantially perpendicular from mold surface 6. The present invention, however, is not limited to such an example. One-dimensional through hole 10 may extend in a direction at an angle substantially constant with respect to mold surface 6. In this example as well, an effect the same as in each embodiment is achieved.

In each embodiment described above, a high-pressure gas supply mechanism may be connected to the back face of upper mold 1. In this manner, a high-pressure gas such as compressed air can be supplied to mold surface 6 through upper mold 1 fabricated with a porous body, thereby reducing pressure loss in one-dimensional communicating holes 10. Therefore, a uniform pressure can be applied to the entire surface of the molded product so as to release the same by supplying compressed air of a lower pressure than in the conventional example, without using the ejector pin pressing a part of the molded product.

Figure 3B:
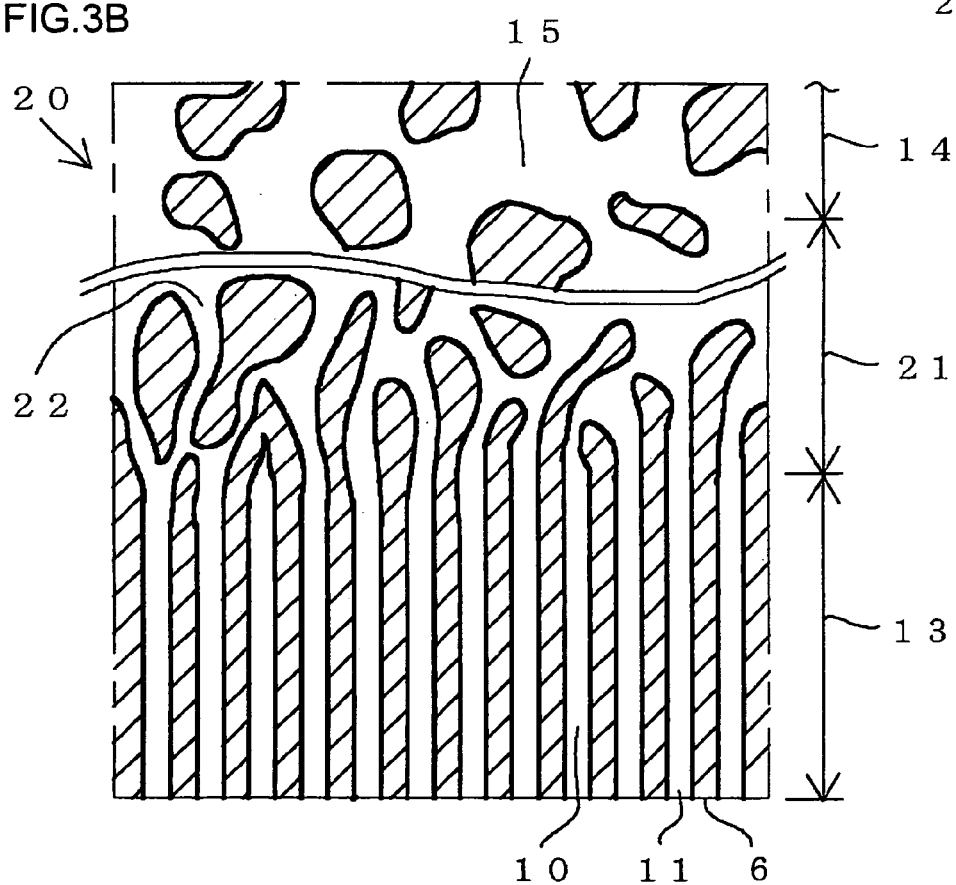
FIG. 3B is a cross-section showing an enlarged view of a portion C in FIG. 3A of the resin mold material according to the present embodiment.

The present invention is not limited to each embodiment described above, and may be susceptible to any combination, modification or selection as required, without departing from the spirit thereof For example, the structure shown in FIGS. 1A, 1B or FIGS. 2A, 2B may be combined with suction mechanism 16 shown in FIGS. 3A, 3B. In addition, in the structure in FIGS. 3A, 3B, support layer 14 may attain a self-heating function.

As described above, according to each embodiment above of the present invention, since a large number of one-dimensional communicating holes having a small hole diameter extend substantially linearly from the surface to serve as the mold surface toward the inside, a large number of small spaces containing air are provided in the vicinity of the surface to serve as the mold surface. Accordingly, a contact area between the surface to serve as the mold surface and the liquid resin is made smaller. In addition, a large number of small spaces containing air less prone to be wetted with the liquid resin are present at an interface between the surface to serve as the mold surface and the liquid resin. Consequently, wettability of the entire surface to serve as the mold surface with respect to the liquid resin is lowered. Therefore, adhesion between the surface to serve as the mold surface and the cured resin formed by curing the liquid resin is lowered. Moreover, when the gas in the cavity is discharged through the one-dimensional communicating holes, pressure loss is reduced. Accordingly, the present invention attains an excellent practical effect in that it provides a resin mold material and a resin mold capable of improving release property of the cured resin from the surface to serve as the mold surface and suppressing generation of voids in the molded product.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin mold material composing a resin mold used when a molded product is manufactured by curing a liquid resin in a cavity, comprising:
   a number of one-dimensional communicating holes; wherein
   each said one-dimensional communicating hole respectively extends substantially linearly from a surface to serve as a mold surface in said resin mold toward inside and respectively has a respective hole diameter in a range from at least 1 nm to less than 1 μm.

2. The resin mold material according to claim 1, further comprising:
   a surface layer including said surface to serve as the mold surface and said one-dimensional communicating holes; and
   a support layer provided below said surface layer; wherein
   said support layer is conductive and generates heat when a current flows therethrough.

3. The resin mold material according to claim 1, wherein said respective hole diameter of each said one-dimensional communicating hole is substantially equal for all of said one-dimensional communicating holes.

4. A resin mold material composing a resin mold used when a molded product is manufactured by curing a liquid resin in a cavity, comprising:
   a number of one-dimensional communicating holes; wherein
   each said one-dimensional communicating hole respectively extends substantially linearly from a surface to serve as a mold surface in said resin mold toward inside and respectively has a respective hole diameter in a range from at least 1 nm to less than 10 μm, and
   a spacing distance of at least 1 nm and less than 10 μm exists between neighboring ones of said one-dimensional communicating holes.

5. The resin mold material according to claim 4, further comprising:
   a surface layer including said surface to serve as the mold surface and said one-dimensional communicating holes; and
   a support layer provided below said surface layer; wherein
   said support layer is conductive and generates heat when a current flows therethrough.

6. The resin mold material according to claim 4, wherein said respective hole diameter of each said one-dimensional communicating hole is substantially equal for all of said one-dimensional communicating holes.

7. A resin mold material composing a resin mold used when a molded product is manufactured by curing a liquid resin in a cavity, comprising:
   a surface layer including a surface to serve as a mold surface;
   a support layer provided below said surface layer; and
   a number of one-dimensional communicating holes provided in said surface layer; wherein
   each said one-dimensional communicating hole respectively extends substantially linearly from said surface to serve as said mold surface in said resin mold toward inside and respectively has a respective hole diameter in a range from at least 1 nm to less than 10 μm,
   said support layer includes a number of three-dimensional communicating holes communicating, to said one-dimensional communicating holes, and
   each said three-dimensional communicating hole respectively has a hole diameter larger than said respective hole diameter of said one-dimensional communicating holes.

8. A resin mold material according to claim 7, wherein said support layer is conductive and generates heat when a current flows therethrough.

9. The resin mold material according to claim 7, wherein said respective hole diameter of each said one-dimensional communicating hole is substantially equal for all of said one-dimensional communicating holes.

10. A resin mold for manufacturing a molded product by molding and curing a resin in a mold cavity of said mold, wherein said resin mold comprises a mold member having a mold surface bounding said mold cavity, said mold member comprises a first material layer having said mold surface and having a plurality of first holes communicating through a thickness of said first material layer, and said first holes respectively have hole diameters of at least 1 nm and less than 1 µm.

11. The resin mold according to claim 10, wherein said first holes are one-dimensional communicating holes extending substantially linearly through said thickness of said first material layer.

12. The resin mold according to claim 10, wherein said hole diameters are all substantially equal to one another.

13. A resin mold for manufacturing a molded product by molding and curing a resin in a mold cavity of said mold, wherein said resin mold comprises a mold member having a mold surface bounding said mold, cavity, said mold member comprises a first material layer having said mold surface and having a plurality of first holes communicating through a thickness of said first material layer, said first holes respectively have hole diameters of at least 1 nm and less than 10 µm, said mold member further comprises a second material layer on a side of said first material layer opposite said mold surface, said second material layer has a plurality of second holes communicating with said first holes and extending through a thickness of said second material layer, said second holes are nonlinear three-dimensional communicating holes, and said second holes have hole areas larger than hole areas of said first holes.

14. The resin mold according to claim 13, wherein said first holes are one-dimensional communicating holes extending substantially linearly through said thickness of said first material layer.

15. The resin mold according to claim 13, wherein said hole diameters are all substantially equal to one another.

* * * * *